(12) United States Patent
Sun et al.

(10) Patent No.: US 8,522,120 B2
(45) Date of Patent: Aug. 27, 2013

(54) SYSTEMS AND METHODS FOR OUT OF ORDER Y-SAMPLE MEMORY MANAGEMENT

(71) Applicant: LSI Corporation, Milpitas, CA (US)

(72) Inventors: Lingyan Sun, Longmont, CO (US);
Hongwei Song, Longmont, CO (US);
YuanXing Lee, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/705,407

(22) Filed: Dec. 5, 2012

(65) Prior Publication Data

US 2013/0097472 A1 Apr. 18, 2013

Related U.S. Application Data

(63) Continuation of application No. 12/491,038, filed on Jun. 24, 2009, now Pat. No. 8,352,841.

(51) Int. Cl.
*H03M 13/00* (2006.01)

(52) U.S. Cl.
USPC ............... 714/780; 714/758; 714/795

(58) Field of Classification Search
USPC ............ 714/780, 752, 758, 746, 795, 702, 714/701, 788
See application file for complete search history.

(56) References Cited

U.S. PATENT DOCUMENTS

| | | | |
|---|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Casado et al., Multiple-rate low-density parity-check codes with constant blocklength, IEEE Transations on communications, Jan. 2009, vol. 57, pp. 75-83.

(Continued)

*Primary Examiner* — Fritz Alphonse
(74) *Attorney, Agent, or Firm* — Hamilton DeSanctis & Cha

(57) ABSTRACT

Systems and methods for out of order memory management.

23 Claims, 4 Drawing Sheets

(56) References Cited

U.S. PATENT DOCUMENTS

| | | |
|---|---|---|
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,551,739 B2 * | 6/2009 | Dube et al. .................. 380/258 |
| 7,565,111 B2 * | 7/2009 | Onggosanusi et al. ...... 455/63.1 |
| 7,587,657 B2 | 9/2009 | Haratsch |
| 7,590,168 B2 | 9/2009 | Raghavan |
| 7,623,597 B2 * | 11/2009 | Yu et al. ....................... 375/340 |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,792,222 B2 * | 9/2010 | Tang et al. ................... 375/341 |
| 7,802,172 B2 | 9/2010 | Vila Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$m) LDPC Decoders", IEEE Transactions on Circuits and Systemssi: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/239,683, Unpublished (filed Sep. 22, 2011) (Changyou Xu).

U.S. Appl. No. 13/316,858, Unpublished (filed Dec. 12, 2011) (Zongwang Li).

U.S. Appl. No. 13/316,741, Unpublished (filed Dec. 12, 2011) (Yang Han).

U.S. Appl. No. 13/445,878, Unpublished (filed Apr. 12, 2012) (Yu Liao).

U.S. Appl. No. 13/327,279, Unpublished (filed Dec. 15, 2011) (Wei Feng).

U.S. Appl. No. 13/340,974, Unpublished (filed Dec. 30, 2011) (Dan Liu).

U.S. Appl. No. 13/445,848, Unpublished (filed Apr. 12, 2012) (Bruce Wilson).

U.S. Appl. No. 13/340,951, Unpublished (filed Dec. 30, 2011) (Lei Chen).

U.S. Appl. No. 13/369,468, Unpublished (filed Feb. 9, 2012) (Zongwang Li).

U.S. Appl. No. 13/269,852, Unpublished (filed Oct. 10, 2011) (Haitao Xia).

U.S. Appl. No. 13/284,730, Unpublished (filed Oct. 28, 2011) (Fan Zhang).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/362,409, Unpublished (filed Jan. 31, 2012) (Fan Zhang).

U.S. Appl. No. 13/227,544, Unpublished (filed Sep. 8, 2011) (Shaohua Yang).

U.S. Appl. No. 13/283,549, Unpublished (filed Oct. 27, 2011) (Wu Chang).

U.S. Appl. No. 13/186,234, Unpublished (filed Jul. 19, 2011) (Haitao Xia).
U.S. Appl. No. 13/213,751, Unpublished (filed Aug. 19, 2011) (Fan Zhang).
U.S. Appl. No. 13/174,453, Unpublished (filed Jun. 30, 2011) (Johnson Yen).
U.S. Appl. No. 13/174,537, Unpublished (filed Jun. 30, 2011) (Anantha Raman Krishnan).
U.S. Appl. No. 13/296,022, Unpublished (filed Nov. 14, 2011) (Victor Krachkovsky).
U.S. Appl. No. 13/305,551, Unpublished (filed Nov. 28, 2011) (Yang Han).
U.S. Appl. No. 13/227,416, Unpublished (filed Sep. 7, 2011) (Lei Chen).
U.S. Appl. No. 13/305,510, Unpublished (filed Nov. 28, 2011) (Lei Chen).
U.S. Appl. No. 13/302,119, Unpublished (filed Nov. 22, 2011) (Lei Chen).
U.S. Appl. No. 13/619,907, Unpublished (filed Sep. 14, 2012) (Fan Zhang).
U.S. Appl. No. 13/300,078, Unpublished (filed Nov. 18, 2011) (Chung-Li Wang).
U.S. Appl. No. 13/180,495, Unpublished (filed Jul. 11, 2011) (Chung-Li Wang).
U.S. Appl. No. 13/269,832, Unpublished (filed Oct. 10, 2011) (Haitao Xia).
U.S. Appl. No. 13/621,341, Unpublished (filed Sep. 17, 2012) (Shaohua Yang).
U.S. Appl. No. 13/989,583, Unpublished (filed Oct. 15, 2012) (Shaohua Yang).
U.S. Appl. No. 13/596,978, Unpublished (filed Aug. 28, 2012) (Fan Zhang).
U.S. Appl. No. 13/415,430, Unpublished (filed Mar. 8, 2012) (Nayak Ratnakar Aravind).
U.S. Appl. No. 13/412,520, Unpublished (filed Mar. 5, 2012) (Fan Zhang).
U.S. Appl. No. 13/597,026, Unpublished (filed Aug. 28, 2012) (Fan Zhang).
U.S. Appl. No. 13/113,219, Unpublished (filed May 23, 2011) (Yang Han).
U.S. Appl. No. 13/597,001, Unpublished (filed Aug. 28, 2012) (Fan Zhang).
U.S. Appl. No. 13/171,615, Unpublished (filed Jun. 29, 2011) (Bradley D. Seago).
U.S. Appl. No. 13/596,819, Unpublished (filed Aug. 28, 2012) (Shaohua Yang).
U.S. Appl. No. 13/545,833, Unpublished (filed Jul. 10, 2012) (Zhi Bin Li).
U.S. Appl. No. 13/433,693, Unpublished (filed Mar. 29, 2012) (Fan Zhang).
U.S. Appl. No. 13/474,660, Unpublished (filed May 17, 2012) (Zongwang Li).
U.S. Appl. No. 13/422,986, Unpublished (filed Mar. 16, 2012) (Fan Zhang).
U.S. Appl. No. 13/372,580, Unpublished (filed Feb. 14, 2012) (Fan Zhang).
U.S. Appl. No. 13/415,326, Unpublished (filed Mar. 8, 2012) (Shaohua Yang).
U.S. Appl. No. 13/426,714, Unpublished (filed Mar. 22, 2012) (Shaohua Yang).
U.S. Appl. No. 13/596,947, Unpublished (filed Aug. 28, 2012) (Fan Zhang).
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nrnsu.edu/~jkliewer/paper/XFKC_CISS06.pdf (retrieved on Dec. 5, 201.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

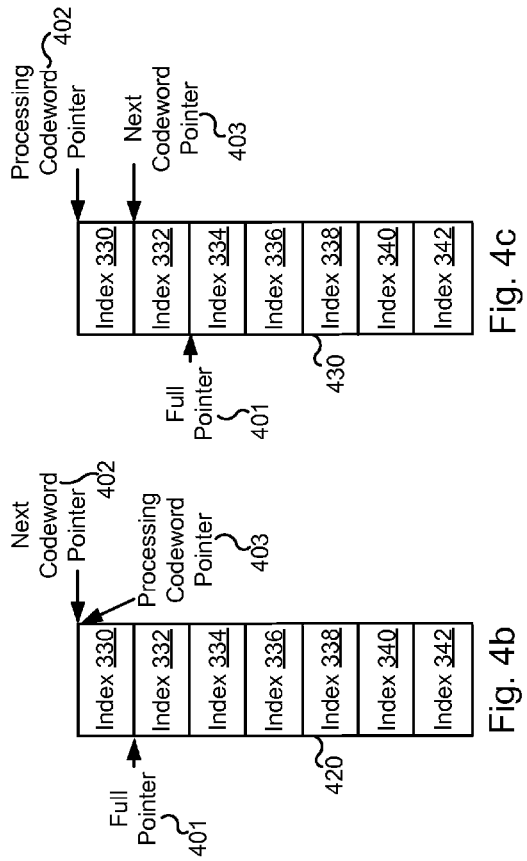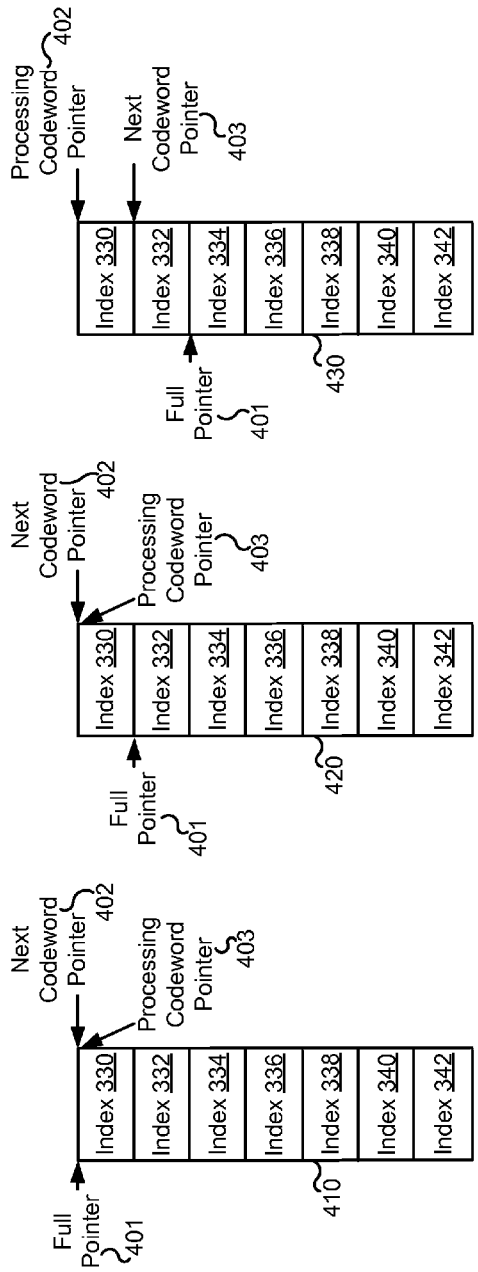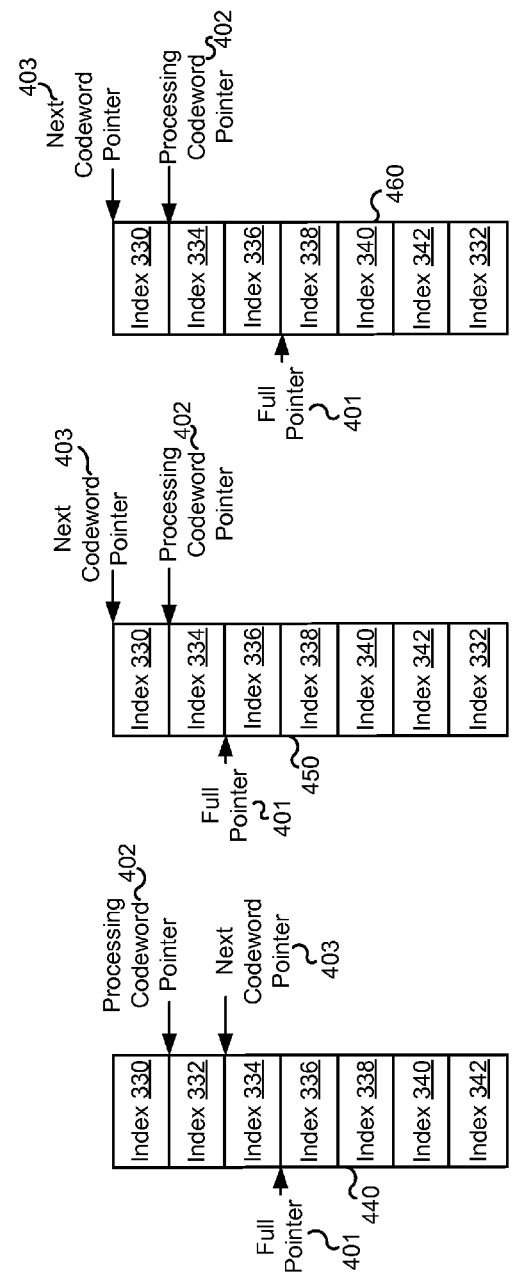

SYSTEMS AND METHODS FOR OUT OF ORDER Y-SAMPLE MEMORY MANAGEMENT

CROSS REFERENCE TO RELATED APPLICATIONS

The present application claims priority to (is a continuation of) U.S. patent application Ser. No. 12/491,038 now issued as U.S. Pat. No. 8,352,841 entitled "Systems and Methods for Out of Order Y-Sample Memory Management" filed by Sun et al. on Jun. 24, 2009. The entirety of the aforementioned reference is incorporated herein by reference for all purposes.

BACKGROUND OF THE INVENTION

The present inventions are related to systems and methods for storing and retrieving data, and more particularly to systems and methods for storing and retrieving data sets for processing in a data detection system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream. In some cases, data detection systems have been developed that allow for processing a codeword multiple times. This increases the possibility of convergence, but at the same time increases the amount of processing power applied to each codeword.

There exists a need in the art for advanced systems and methods for data processing.

BRIEF SUMMARY OF THE INVENTION

The present inventions are related to systems and methods for storing and retrieving data, and more particularly to systems and methods for storing and retrieving data sets for processing in a data detection system.

Various embodiments of the present invention provide data processing systems that include a processing loop circuit, a queuing buffer, and an out of order codeword memory circuit. The processing loop circuit includes a first data detector providing a first detected output, a second data detector providing a second detected output, and a soft decision decoder that applies a soft decoding algorithm to a derivative of the first detected output to yield a soft decision output. The queuing buffer is operable to store the soft decision output. The out of order codeword memory circuit receives a plurality of data sets, and provides one of the plurality of data sets corresponding to the soft decision output to the second data detector. The second data detector is operable to perform a data detection on a derivative of the soft decision output and the one of the plurality of data sets corresponding to the soft decision output. In some cases, the data detector may be a soft output Viterbi algorithm detector, or a maximum a posteriori detector; and the soft decision decoder may be an LDPC decoder applying an LDPC algorithm.

In some instances of the aforementioned embodiments, the out of order codeword memory circuit includes a codeword memory area and an index area. Ion some such cases, the codeword memory area includes a first number of codeword memory locations, and the index area includes a second number of index value locations. In particular instances, the first number and the second number are the same.

In various instances of the aforementioned embodiments, the plurality of data sets are each stored in respective codeword memory locations. In such instances, a stored data set remains in the same codeword memory location during the time it is maintained in the codeword memory area regardless of any out of order processing completion of other of the data sets stored in the codeword memory area. In some cases, upon convergence of a data set stored in a particular codeword memory location, an index in the index area corresponding to the particular codeword memory location is grouped with at least on other index in the index area that identify unused codeword memory locations.

In some instances of the aforementioned embodiments, each of the values in the index area corresponds to a respective codeword memory location. In one or more instances of the aforementioned embodiments, the out of order codeword memory circuit further includes a pointer controller circuit, that is operable to provide a pointer identifying an index value in the index area corresponding to an unused codeword memory location to be written upon receiving the next data set. In some cases, the pointer is modified to identify another index value in the index area corresponding to another unused codeword memory location to be written upon receiving the next data set when a data set is stored to the codeword memory area. In some instances of the aforementioned embodiments, the pointer controller circuit is operable to provide a pointer identifying an index value in the index area corresponding to a codeword memory location that holds the next data set to be provided to the second data detector. In some such instances, the pointer is modified to identify another index value in the index area corresponding to another codeword memory location that holds the next data set to be provided to the second data detector whenever a data set is provided from the codeword memory area to the second data detector. In particular instances, the pointer controller circuit is operable to provide a pointer identifying an index value in the index area corresponding to a codeword memory location that holds a data set currently being processed in the soft decision decoder.

Other embodiments of the present invention provide methods for out of order data processing. The methods include providing an out of order codeword memory circuit that includes a number of codeword memory locations in a codeword memory area and the same number of index values in an index area. Each of the index values corresponds to a respective one of the codeword memory locations. The methods further include receiving a data set; storing the data set to one of the codeword memory locations; receiving an indication that the data set stored in the one of the codeword memory locations has completed processing; and grouping an index value corresponding to the one of the codeword memory locations with one or more other index values corresponding to unused codeword memory locations.

In some instances of the aforementioned embodiments, the data set is a previous data set, and the method further includes updating a pointer identifying an index value in the index area corresponding to an unused codeword memory location to be written upon receiving a next data set. In other instances of the aforementioned embodiments, the data set is a first data set, and the method further includes accessing a second data set from another of the codeword memory locations; and updating a pointer identifying an index value in the index area corresponding to a next codeword memory location to be accessed upon accessing the second data set. In some instances, the method further includes providing a processing loop circuit that includes a first data detector, a second data detector, and a soft decision decoder. The first data detector provides a first detected output, and the soft decision decoder applies a soft decoding algorithm to a derivative of the first detected output to yield a soft decision output. In such cases, the second data set corresponds to the soft decision output. In addition, a queuing buffer that is operable to store the soft decision output is provided. The methods further include accessing the soft decision output and providing the second data set and the soft decision output to the second data detector.

Yet other embodiments of the present invention provides a storage device that includes a storage medium, a read/write head assembly disposed in relation to the storage medium, and a read channel circuit. The read channel circuit receives a plurality of data sets accessed from the storage medium by the read/write head assembly. The read channel circuit includes: a processing loop circuit, a queuing buffer, and an out of order codeword memory circuit. The processing loop circuit includes a first data detector, a second data detector, and a soft decision decoder. The first data detector provides a first detected output, and the soft decision decoder applies a soft decoding algorithm to a derivative of the first detected output to yield a soft decision output. The queuing buffer is operable to store the soft decision output. The out of order codeword memory circuit receives the plurality of data sets, and provides one of the plurality of data sets corresponding to the soft decision output to the second data detector. The second data detector is operable to perform a data detection on a derivative of the soft decision output and the one of the plurality of data sets corresponding to the soft decision output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 4a-4f graphically show the process of storing codewords to and accessing codewords from an out of order codeword memory in accordance with one or more embodiments of the present invention.

DETAILED DESCRIPTION OF THE INVENTION

The present inventions are related to systems and methods for storing and retrieving data, and more particularly to systems and methods for storing and retrieving data sets for processing in a data detection system.

Figure 1:
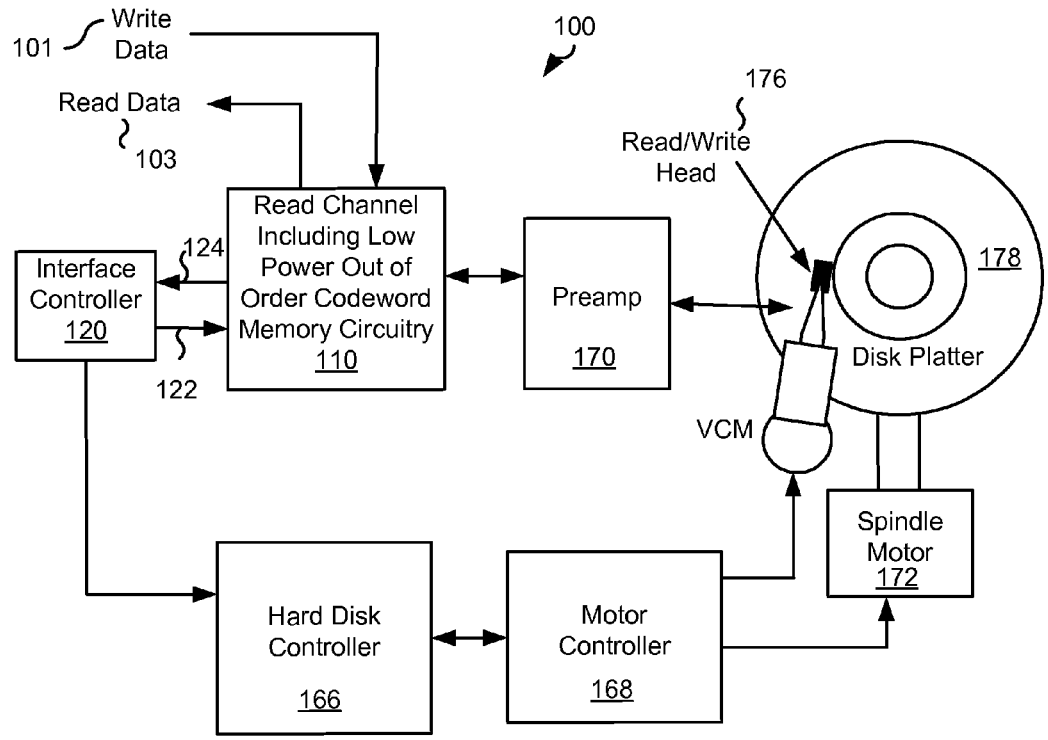
FIG. 1 shows a storage system including a read channel module that includes low power, out of order codeword memory circuitry in accordance with one or more embodiments of the present invention.

Turning to FIG. 1, a storage system 100 including read channel circuit 110 with low power, out of order codeword memory circuitry in accordance with various embodiments of the present invention. Storage system 100 may be, for example, a hard disk drive. Read channel circuit 110 may include a queue based decoder/detection system similar to that discussed below in relation to FIG. 2 that includes low, power out of order codeword memory.

Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Figure 2:
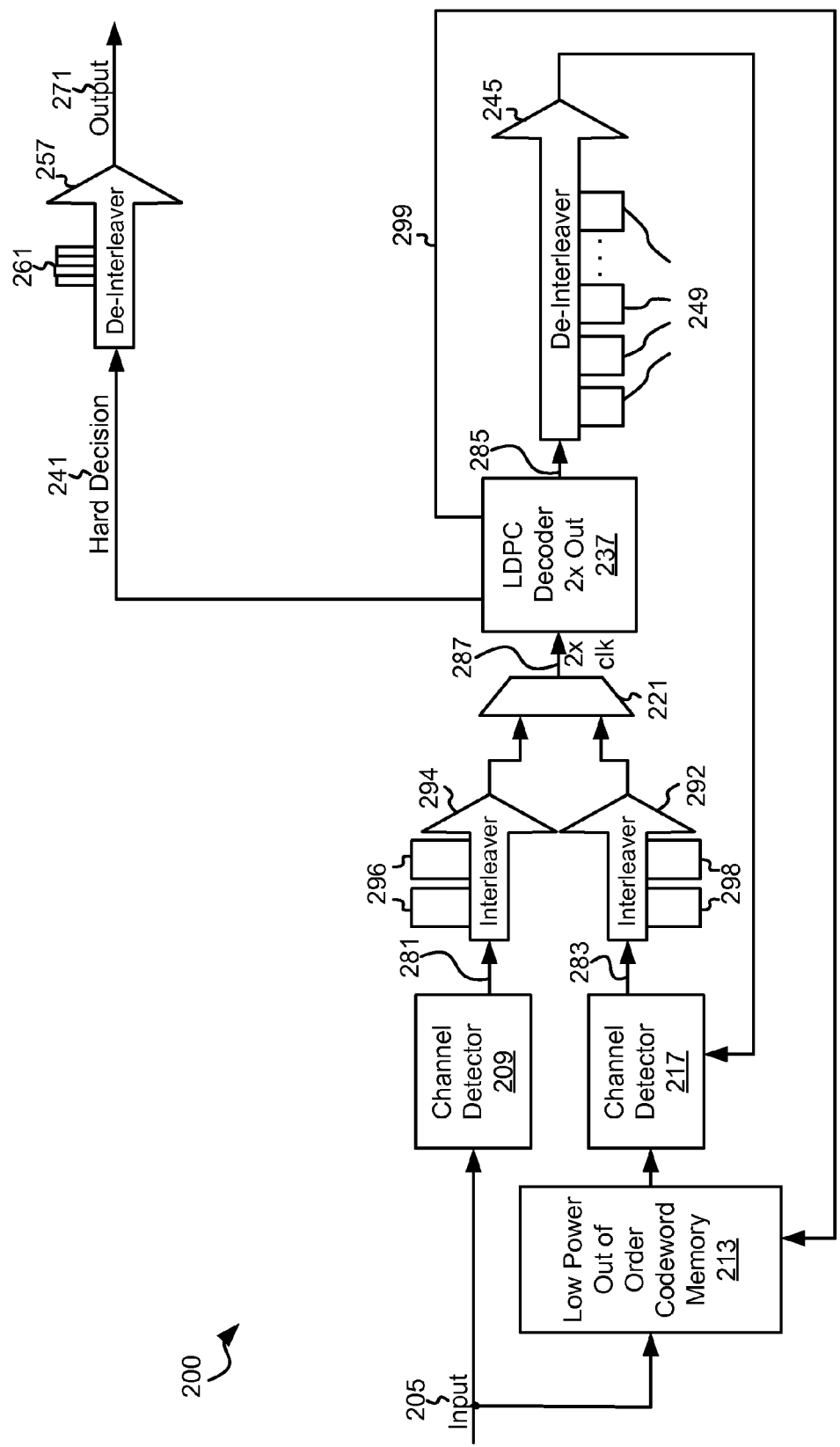
FIG. 2 depicts a queuing detection and decoding circuit including low power out of order codeword memory circuitry in accordance with one or more embodiments of the present invention.

Turning to FIG. 2, a queuing detection and decoding circuit 200 including a low power, out of order codeword memory 213 is shown in accordance with various embodiments of the present invention. Low power, out of order codeword memory 213 provides storage space for Y-samples received via an input 205 for a defined number of codewords. In operation, the stored Y-samples are removed from low power, out of order codeword memory 213 when the codeword corresponding to the Y-sample converges. As each codeword potentially converges after a different number of iterations, Y-samples may be removed from low power, out of order codeword memory 213 in an order that is different from the order that they were received. Removing a codeword results in an unused codeword memory location that can be filled when a new Y-sample is received. Management of low power, out of order codeword memory 213 involves determining which codeword memory locations in low power, out of order codeword memory 213 are free and able to accept a newly received Y-sample, which codeword memory locations are full, and which codeword memory locations can be identified as unused based upon convergence of codeword processing.

In some embodiments of the present invention, when data is removed from the codeword memory due to codeword convergence, memory contents may be shifted using an out of order shift register that shifts later data to a higher position in the shift register when convergence occurs. Further, the shift register allows for storing data to the unused data region closest to the top of the shift register. Such an approach assures that the contents of the codeword memory are always in order. However, where codewords may be many thousands of bits in length, such an approach results in shifting a very large number of bits with the corresponding power consumption associated therewith. In other embodiments of the present invention, a lower power, out of order memory is implemented. An example of such a low power is describe in relation to FIG. 3 below. Such a low power memory allows data to be maintained out of order without requiring thousands of shifts, and thus resulting in considerable power savings when compared to the aforementioned shift approach.

Queuing detection and decoding circuit 200 includes data input 205 that is fed to a channel detector 209. In some embodiments, data input 205 may be derived from a storage medium. In particular cases, data input 205 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 209 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 205 is provided to low power, out of order codeword memory 213 that is designed to hold a number of data sets received from data input 205. The size of low power, out of order codeword memory 213 may be selected to provide sufficient buffering such that a data set provided via data input 205 remains available at least until a first iteration processing of that same data set is complete and the processed data is available in a queue buffer 249 as more fully described below. In one particular embodiment of the present invention, low power, out of order codeword memory 213 includes storage sufficient to hold seven codewords simultaneously. Low power, out of order codeword memory 213 provides the data sets to a channel detector 217. Similar to channel detector 209, channel detector 217 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

An output 281 of channel detector 209 is provided to an interleaver circuit 294, and an output 283 of channel detector 217 is provided to another interleaver circuit 292. Interleaver circuit 294 interleaves the output of channel detector 209 using a ping pong buffer 296, and interleaver circuit 292 interleaves the output of channel detector 217 using a ping pong buffer 298. One of the buffers in ping pong buffer 296 holds the result of a prior interleaving process of the output from channel detector 209 and is unloaded to an LDPC decoder 237 via a multiplexer 221, while the other buffer of ping pong buffer 296 holds a data set from channel detector 209 that is currently being interleaved. Similarly, one of the buffers in ping pong buffer 298 holds the result of a prior interleaving process of the output from channel detector 217 and is unloaded to LDPC decoder 237 via a multiplexer 221, while the other buffer of ping pong buffer 298 holds a data set from channel detector 217 that is currently being interleaved. It should be noted that other soft decision data decoders may be used in place of LDPC decoder 237 in different embodiments of the present invention.

LDPC decoder 237 is capable of decoding one or more data sets simultaneously. As an example, LDPC decoder 237 may be designed to decode an interleaved data set from ping pong buffer 296, to decode an interleaved data set from ping pong buffer 298, or to decode interleaved data sets from ping pong buffer 296 and ping pong buffer 298 simultaneously. The decoded data is either provided as a hard decision output 241 or to a de-interleaver circuit 245 that uses queue buffer 249 to de-interleave the decoded data and to store the de-interleaved data until channel detector 217 is available for further processing. LDPC decoder 237 provides a combination output 299 that provides status to low power, out of order codeword memory 213. In some cases, combination output 299 includes a codeword processing signal and a codeword completed signal as more fully described below in relation to FIG. 3.

One of the buffers in queue buffer 249 holds the result of a prior de-interleaving process and is unloaded to channel detector 217, while another buffer of queue buffer 249 holds a decoded data set currently being de-interleaved, and one or more other buffers in queue buffer 249 maintain other non-converged data waiting for processing by channel detector 217. Non-converged data from queue buffer 249 is de-interleaved by de-interleaver 245 and passed to channel detector 217 that has access to the corresponding data set in low power, out of order codeword memory 213. The data detection performed by channel detector 217 is similar to that performed by channel detector 209. Hard decision output 241 is provided to a de-interleaver circuit 257 that de-interleaves the received hard decision output 241 and stores the de-interleaved result in one of a number of memory buffers 261. Ultimately, de-interleaver circuit 257 provides the de-interleaved data stored in memory buffers 261 as an output 271.

Queuing detection/decoding circuit 200 allows for performance of a variable number of detection and decoding iterations depending upon the introduced data. Further, in some cases, considerable power savings may be achieved through use of queuing detection/decoding circuit 200. These power savings may be enhanced where low power, out of order codeword memory 213 is designed to minimize the amount of power dissipated in the storage of and the accessing of codewords stored thereing. Yet further, in some cases, a faster LDPC decoder may be implemented allowing for an increased throughput where substantial first iteration data convergence exists as multiple iterations are not necessarily required. Yet further, by allowing results of LDPC decoder 237 to be reported out of order, upstream processing does not have to wait for the completion of downstream processing. Re-ordering of the out of order results may be done by queuing detection/decoding circuit 200 or by a downstream recipient of output 271.

In operation, a first data set is introduced via data input 205 to channel detector 209. Channel detector 209 performs its channel detection algorithm and provides both a hard output and a soft output to interleaver circuit 294 that interleaves the received data into one buffer of ping pong buffer 296. Interleaver 294 may interleave the data set by writing consecutive data into non-consecutive memory/buffer addresses based on the interleaver algorithm/mapping. Interleaved data is provided from the other buffer of ping pong buffer 296 to LDPC decoder 237 via multiplexer 221. LDPC decoder 237 performs a data decoding process. Where the decoding process converges, LDPC decoder 237 writes its output as hard decision output 241 to output data buffer 261 and the processing is completed for that particular data set. At the same time, the codeword in low power, out of order codeword memory 213 corresponding to the converged data provided as hard decision output 241 is eliminated from low power, out of order codeword memory 213 using one or more processes described below. Alternatively, where the data does not converge, LDPC decoder 237 writes its output (both soft and hard) to queue buffer 249. The scheduling guarantees that there is at least one empty buffer for holding this new set of data, and this strategy assures that each data input is guaranteed the possibility of at least two global iterations (i.e., two passes through a detector and decoder pair).

At some point later, the data set left in queue buffer 249 is provided from queue buffer 249 to channel detector 217. Channel detector 217 selects the data set that corresponds to the output in queue buffer 249 from low power, out of order codeword memory 213 and performs a subsequent data detection aided by the soft output data generated by LDPC decoder 237 fed back from queue buffer 249. By using the previously generated soft data for data maintained in low power, out of order codeword memory 213, channel detector 217 generally performs a subsequent channel detection with heightened accuracy. The process of accessing a codeword from low power, out of order codeword memory 213 is more fully described below. The output of this subsequent channel detection is passed to interleaver circuit 292 that interleaves the received data into one buffer of ping pong buffer 298. Interleaver 292 may interleave the data set by writing consecutive data into non-consecutive memory/buffer addresses based on the interleaver algorithm/mapping. Interleaved data is provided from the other buffer of ping pong buffer 298 to LDPC decoder 237 via multiplexer 221. LDPC decoder 237 provides another decoding pass to the data. Similar to the first iteration, a decision is made as to whether the data converged. Where the data converged, LDPC decoder 237 writes its output as hard decision output 241 to output data buffer 261 and the processing is complete for that particular data set. Alternatively, where the data does not converge, LDPC decoder 237 writes its output (both soft and hard) to queue buffer 249 where it is processed using hard decision decoder 297 and passed back to channel detector 217 for another global iteration where such is necessary and possible.

Figure 3:
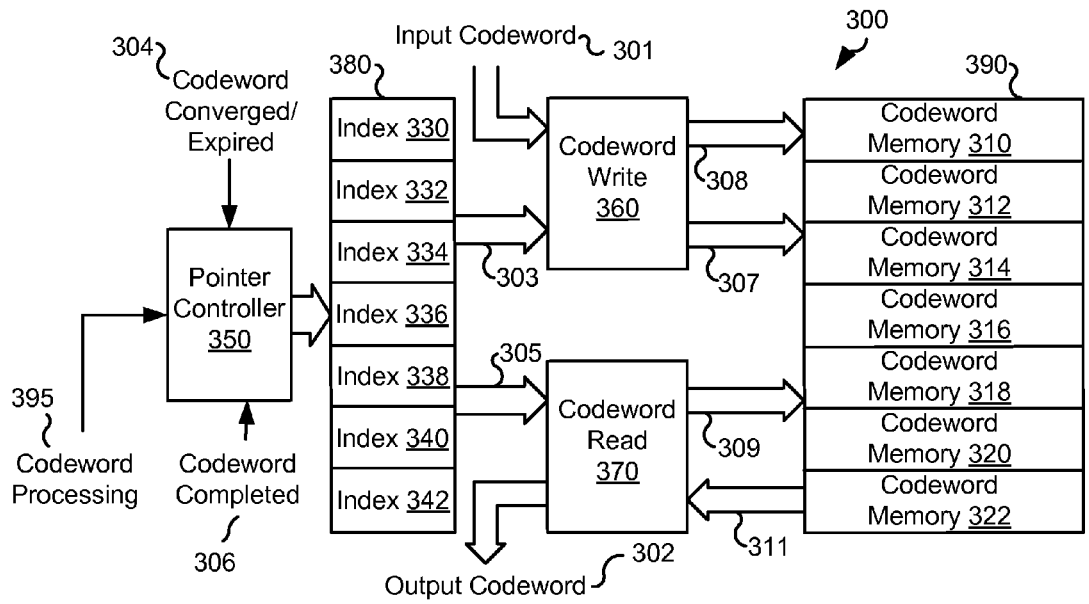
FIG. 3 graphically depicts an out of order codeword memory circuit in accordance with some embodiments of the present invention.

Turning to FIG. 3, an out of order codeword memory circuit 300 is depicted in accordance with some embodiments of the present invention. Codeword memory circuit 300 may be used in place of low power, out of order codeword memory 213. Codeword memory circuit 300 includes a codeword memory area 390 divided into sub-memories (i.e., storage locations) each capable of storing one codeword. In particular, codeword memory area 390 includes seven codeword memories: (1) codeword memory 310, (2) codeword memory 312, (3) codeword memory 314, (4) codeword memory 316, (5) codeword memory 318, (6) codeword memory 320, and (7) codeword memory 322. It should be noted that different embodiments of the present invention may utilize different numbers of codeword memories depending upon the design needs. In some embodiments of the present invention, codeword memory area 390 is a single randomly accessible memory area. In one particular embodiment of the present invention, codeword memory area 390 is implemented using dynamic randomly accessible memory (DRAM) technology. Based upon the disclosure provided herein, one of ordinary skill in the art will recognize a variety of storage technologies known in the art that may be used to implement codeword memory area 390 in accordance with different embodiments of the present invention.

In addition, an index area 380 is provided that includes a number of index values (i.e., index 330, index 332, index 334, index 336, index 338, index 340 and index 342) that each correspond to a respective one of codeword memories 310, 312, 314, 316, 318, 320, 322. In the case where seven codeword memories are employed, each of the index values is implemented in a three bit register. As an example, index 330 may be a three bit value '000' corresponding to codeword memory 310; index 332 may be a three bit value '001' corresponding to codeword memory 312; index 334 may be a three bit value '010' corresponding to codeword memory 314; index 336 may be a three bit value '011' corresponding to codeword memory 316; index 338 may be a three bit value '100' corresponding to codeword memory 318; index 340 may be a three bit value '101' corresponding to codeword memory 320; and index 342 may be a three bit value '110' corresponding to codeword memory 322.

Codeword memory circuit 300 further includes a pointer controller circuit 350 that governs which index value is written to a particular index location in index area 380. Pointer controller circuit 350 includes three registers that respectively include a currently processing codeword pointer, a next codeword pointer, and a full pointer. Pointer controller circuit 350 updates the currently processing codeword pointer to identify the codeword memory in codeword memory area 390 that contains the codeword currently being processed. Pointer controller circuit 350 updates the next codeword pointer to identify the codeword memory in codeword memory area 390 that will be accessed next for processing. Pointer controller circuit 350 updates the full pointer to identify which of codeword memories 310, 312, 314, 316, 318, 320, 322 are used, and which are not (i.e., indicating the boundary between used codeword memory locations and unused codeword memory locations). In addition, pointer controller circuit 350 continuously reorders the index values in index area 380 so that unused ones of codeword memories 310, 312, 314, 316, 318, 320, 322 are grouped together and used ones of codeword memories 310, 312, 314, 316, 318, 320, 322 are grouped together. Operation of pointer controller circuit 350 is governed by a codeword converged/expired input signal 304, a codeword completed signal 306, and a codeword processing signal 395 as is more fully described below in relation to FIG. 4. In instances where more than one codeword may be processing at the same time, a single bit may be employed to indicate the occurrence of multiple concurrent processing.

A codeword write circuit 360 uses the index selected by the full pointer (received as an offset input 303 from index area 380) to identify the codeword memory into which an input codeword 301 is to be written. Codeword write circuit 360 provides an offset output 307 and a data output 308 to codeword memory area 390. Data output 308 corresponds to input codeword 301. In turn, codeword memory area 390 stores input codeword 301 to an address in codeword memory area 390 corresponding to offset output 307. In some cases, input codeword 301 is received one word at a time. In such cases, each word of input codeword 301 is provided as data output 308 that is written to a location in a selected codeword memory corresponding to offset input 307. In such a case, offset output 307 may include offset input 303 as its highest order bits, and the lower order bits are sequentially incremented as each word of input codeword 301 are presented as data output 308. It should be noted that other approaches for addressing and writing data to codeword memory area 390 are possible in accordance with other embodiments of the present invention.

A codeword read circuit 370 uses the index selected by the next codeword pointer (received as an offset input 305 from index area 380) to identify the codeword memory from which a codeword is to be read. The read codeword is provided as output codeword 302. Codeword read circuit 370 provides an offset output 309 to codeword memory area 390 and a data input 311 from codeword memory area 390. Output codeword 302 corresponds to data input 311. In turn, codeword memory area 390 retrieves data input 311 from an address in codeword memory area 390 corresponding to offset output 309. In some cases, data input 311 is provided one word at a time. In such cases, each word of data input 311 is read from a location in a selected codeword memory corresponding to offset input 305. In such a case, offset output 309 may include offset input 305 as its highest order bits, and the lower order bits are sequentially incremented as each word of data input 311 are to be retrieved from codeword memory region 390. It should be noted that other approaches for addressing and accessing data from codeword memory area 390 are possible in accordance with other embodiments of the present invention.

An exemplary operation of codeword memory circuit 300 is discussed in relation to FIGS. 4a-4f that graphically depict index area 380 in relation to a full pointer 401, a next codeword pointer 402 and a processing codeword pointer 403 as index area 380 transforms during codeword processing. Of note, full pointer 401, next codeword pointer 402 and processing codeword pointer 403 are provided by pointer controller circuit 350 as described above in relation to FIG. 3 above. Turning to FIG. 4a, index area 380 is shown as graphical depiction 410. Graphical depiction 410 shows index area 380 prior to the occurrence of any data processing. In this case, index values 330, 332, 334, 336, 338, 340, 342 are still in order and full pointer points at the top of index area 380 indicating that the codeword memories corresponding to each of the respective index values are unused. Further, next codeword pointer 402 and processing codeword pointer 403 both point at index value 330 as they are currently not relevant as no codeword processing has yet been performed.

Turning to FIG. 4b, a codeword is eventually received consistent with a graphical depiction 420 of index area 380. This codeword receipt corresponds to providing input 205 from FIG. 2 as codeword input 301 of FIG. 3. The received codeword is stored in the next unused codeword memory as indicated by full pointer 401. In this case, the next unused codeword memory is the codeword memory corresponding to index 330 (e.g., codeword memory 310). In some cases, writing the data includes sequentially directing received portions of the codeword to sequential locations in the codeword memory corresponding to index 330. In addition, full pointer 401 is updated to indicate that the codeword memory corresponding to index 330 is used, and all other codeword memories are unused. As updated, full pointer 401 directs the next received codeword to be written to the codeword memory corresponding to index 332.

Turning to FIG. 4c, a codeword is received consistent with a graphical depiction 430 of index area 380. Again, this codeword receipt corresponds to providing input 205 from FIG. 2 as codeword input 301 of FIG. 3. The received codeword is stored in the next unused codeword memory as indicated by full pointer 401. In this case, the next unused codeword memory is the codeword memory corresponding to index 332 (e.g., codeword memory 312). In some cases, writing the data includes sequentially directing received portions of the codeword to sequential locations in the codeword memory corresponding to index 332. In addition, full pointer 401 is updated to indicate that the codeword memory corresponding to index 330 and index 332 are used, and all other codeword memories are unused. As updated, full pointer 401 directs the next received codeword to be written to the codeword memory corresponding to index 334.

In addition, the codeword from the codeword memory corresponding to index 330 is read from codeword memory area 390 and forwarded as output codeword 302 for processing by a codeword processing circuit. When a codeword is pulled out of codeword memory area 390 for processing, codeword processing signal 395 is asserted. Upon assertion of codeword processing signal 395, next codeword pointer 403 is updated to indicate that the codeword corresponding to index 332 is the next codeword for processing. Processing codeword pointer 402 remains unchanged.

Turning to FIG. 4d, a codeword is received consistent with a graphical depiction 440 of index area 380. Again, this codeword receipt corresponds to providing input 205 from FIG. 2 as codeword input 301 of FIG. 3. The received codeword is stored in the next unused codeword memory as indicated by full pointer 401. In this case, the next unused codeword memory is the codeword memory corresponding to index 334 (e.g., codeword memory 314). In some cases, writing the data includes sequentially directing received portions of the codeword to sequential locations in the codeword memory corresponding to index 334. In addition, full pointer 401 is updated to indicate that the codeword memory corresponding to index 330, index 332 and index 334 are used, and all other codeword memories are unused.

In addition, the codeword from the codeword memory corresponding to index 332 is read from codeword memory area 390 and forwarded as output codeword 302 for processing by a codeword processing circuit. When a codeword is pulled out of codeword memory area 390 for processing, codeword processing signal 395 is asserted. Upon assertion of codeword processing signal 395, next codeword pointer 403 is updated to indicate that the codeword corresponding to index 334 is the next codeword for processing. In addition, codeword completed signal 306 is asserted indicating that processing of a codeword has completed. In this case, it is the codeword provided for processing in relation to FIG. 4c above. Upon assertion of codeword completed signal 306, processing codeword pointer 402 is updated to indicate that the currently processing codeword corresponds to index 332.

Turning to FIG. 4e, the currently processing codeword 332 converges as is demonstrated by a graphical depiction 450 of index area 380. As such, codeword converged/expired signal 304 is asserted indicating convergence of the processing codeword. In this case, the codeword corresponding to the currently processing codeword in codeword memory area 390 is invalidated and the codeword memory that holds the converged codeword is identified as unused. In this case, the codeword that was currently processing corresponds to index 332. Invalidating the codeword includes moving index 332 into the group of indexes identified as unused. In this case, index 332 is moved to the end of index area 380. As such, full pointer 401 indentifies only codeword memories corresponding to index 330 and index 334 as used, and codeword memories corresponding to index 336, index 338, index 340, index 342 and index 332 as unused.

In addition, the codeword corresponding to index 334 is read from codeword memory area 390 and forwarded as output codeword 302 for processing by a codeword processing circuit. Again, when a codeword is pulled out of codeword memory area 390 for processing, codeword processing signal 395 is asserted. Upon assertion of codeword processing signal 395, next codeword pointer 403 is updated to indicate that the codeword corresponding to index 330 is the next codeword for processing. In addition, codeword completed signal 306 is asserted indicating that processing of a codeword has completed. In this case, it is the codeword provided for processing in relation to FIG. 4c above. Upon assertion of codeword completed signal 306, processing codeword pointer 402 is updated to indicate that the currently processing codeword corresponds to index 334.

Turning to FIG. 4f, a codeword is received consistent with a graphical depiction 460 of index area 380. This codeword receipt corresponds to providing input 205 from FIG. 2 as codeword input 301 of FIG. 3. The received codeword is stored in the next unused codeword memory as indicated by full pointer 401. In this case, the next unused codeword memory is the codeword memory corresponding to index 336 (e.g., codeword memory 316). In some cases, writing the data includes sequentially directing received portions of the codeword to sequential locations in the codeword memory corresponding to index 336. In addition, full pointer 401 is updated to indicate that the codeword memory corresponding to index 336 is used, and codeword memories corresponding to index 338, index 340, index 342 and index 332 are unused.

Figure 5:
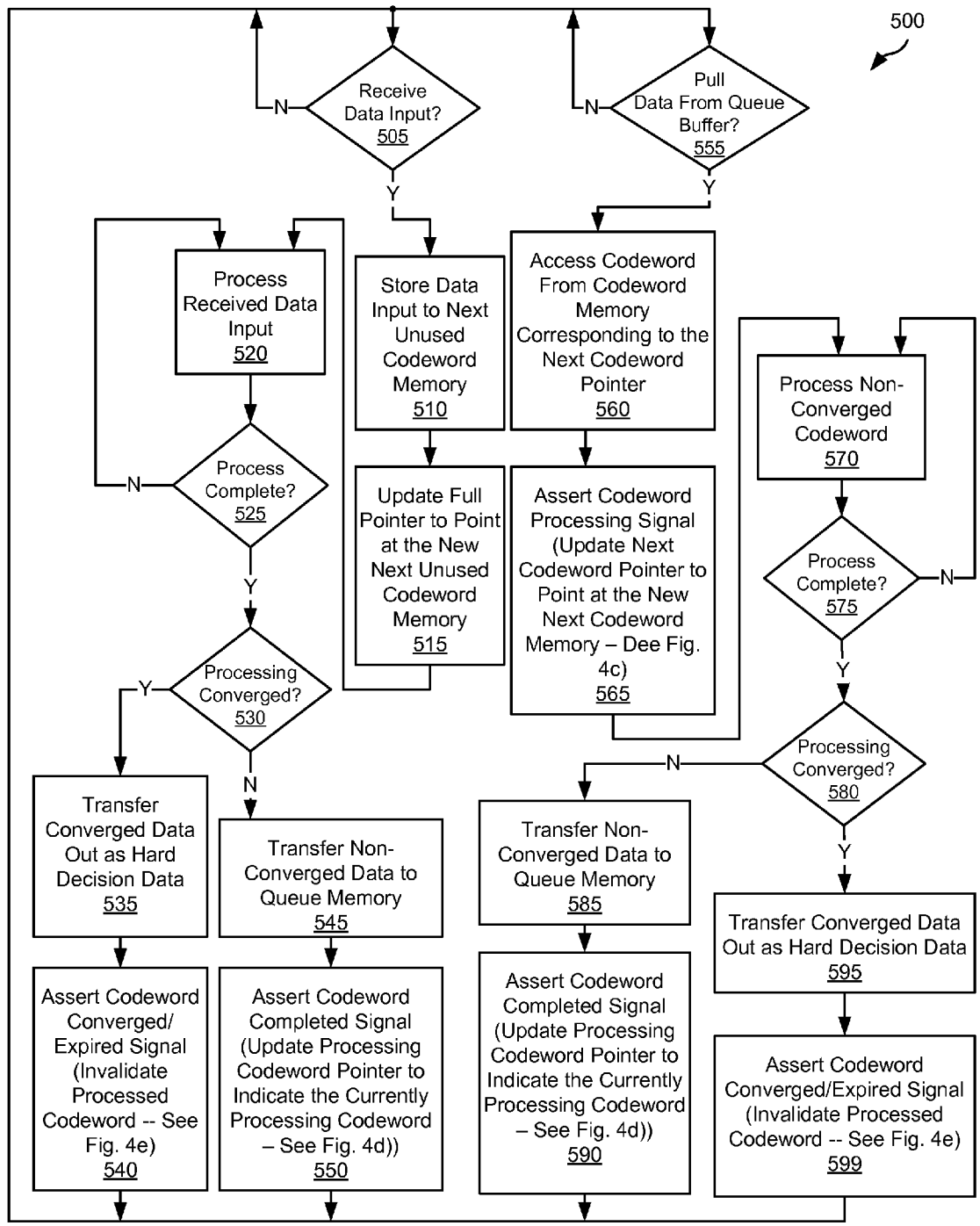
FIG. 5 is a flow diagram showing a method in accordance with some embodiments of the present invention for out of order codeword processing.

Turning to FIG. 5, a flow diagram 500 shows a method in accordance with some embodiments of the present invention for out of order codeword processing. Following flow diagram 500, it is determined whether a data input is received (block 505). A data input may be received one codeword at a time. For example, where the decoding system of FIG. 2 is used, the receipt of a data input corresponds to receiving an input via input 205. Where a data input is received (block 505), the data input is stored to the next unused codeword memory (block 510). The next unused codeword memory is identified by the full data pointer. In addition, the full data pointer is updated to point at a new next unused codeword memory (block 515). An example of this process is shown in the transition between graphical depiction 410 of FIG. 4a and graphical depiction 420 of FIG. 4b.

The newly received data is processed using the provided data processing circuitry (block 520). For example, where the data processing circuit of FIG. 2 is used, the received data may be provided to channel detector 209, and then on to LDPC decoder 237. It is determined whether the processing of the newly received data has completed (block 525). Once data processing completes (block 525), it is determined whether the processing converged (block 530). Where the data processing has converged (block 530), the converged data is provided as a hard output (block 535). As an example, where the data processing circuit of FIG. 2 is used, the data is provided as hard decision output 241. In addition, the codeword converged/expired signal is asserted (block 540). As described above in relation to FIG. 4e, such an assertion results in invalidating the data stored in the codeword memory. This invalidation involves moving the index corresponding to the codeword memory in which the recently converged codeword was stored is grouped with the indexes that correspond to unused codeword memories.

Where, on the other hand, data processing did not converge (block 530), the non-converged data is provided to a queue memory to await additional processing (block 545). In addition, the codeword completed signal is asserted (block 550). As described above in relation to FIG. 4d, such an assertion results in updating the processing codeword pointer to indicate the currently processing codeword.

In parallel with the above mentioned processing, it is determined whether there is processing time available in the processing circuit such that a non-converged codeword can be pulled from the queue memory and re-processed (block 555). For example, where the decoding system of FIG. 2 is used, the receipt of a data input corresponds to receiving a non-converged codeword from queue buffer 249 to channel detector 217. Where a non-converged codeword is pulled from the queue memory (block 555), the corresponding codeword is pulled from the codeword memory (block 560). The corresponding codeword is identified by the next codeword pointer. In addition, the codeword processing signal is asserted (block 565). Upon such an assertion, the next codeword pointer is updated to point at the new next codeword similar to that described above in relation to the transition between FIG. 4b and FIG. 4c.

The non-converged codeword is processed using the provided data processing circuitry (block 570). For example, where the data processing circuit of FIG. 2 is used, the non-converged codeword is processed by channel detector 217, and then by LDPC decoder 237. It is determined whether the processing of the non-converged codeword has completed (block 575). Once data processing completes (block 575), it is determined whether the processing converged (block 580). Where the data processing has converged (block 580), the converged data is provided as a hard output (block 595). As an example, where the data processing circuit of FIG. 2 is used, the data is provided as hard decision output 241. In addition, the codeword converged/expired signal is asserted (block 599). As described above in relation to FIG. 4e, such an assertion results in invalidating the data stored in the codeword memory. This invalidation involves moving the index corresponding to the codeword memory in which the recently converged codeword was stored is grouped with the indexes that correspond to unused codeword memories.

Where, on the other hand, data processing did not converge (block 580), the non-converged data is provided again to the queue memory to await additional processing (block 585). In addition, the codeword completed signal is asserted (block 590). As described above in relation to FIG. 4d, such an assertion results in updating the processing codeword pointer to indicate the currently processing codeword.

In conclusion, the invention provides novel systems, devices, methods and arrangements for memory management of out of order codewords. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
an out of order codeword memory circuit operable to receive at least a first data set and a second data set, and wherein the out of order codeword memory circuit is operable to provide one of the first data set or the second data set as a processing input selected based at least in part on a first soft decision output corresponding to the first data set and a second soft decision output corresponding to the second data set.

2. The data processing system of claim 1, the data processing system further comprising:
  a data processing circuit including:
    a data detector circuit operable to apply a data detection algorithm to the first data set to yield the first soft decision output, and to the second data set to yield the second soft decision output.

3. The data processing system of claim 2, wherein the data detection algorithm is selected from a group consisting of: a soft output Viterbi algorithm, and a maximum a posteriori algorithm.

4. The data processing system of claim 2, wherein the data detector circuit is a first data detector circuit, and wherein the data processing circuit further comprises:
  a second data detector circuit operable to apply the data detection algorithm to the processing input.

5. The data processing system of claim 2, wherein the data processing circuit further comprises:
  a data decoder circuit operable to apply a data decoding algorithm to the first soft decision output to yield a first decoded output, and to the second soft decision output to yield a second decoded output.

6. The data processing system of claim 3, wherein the data decoding algorithm is a low density parity check data decoding algorithm.

7. The data processing system of claim 1, wherein the data processing system is implemented as part of an integrated circuit.

8. The data processing system of claim 1, wherein the data processing system is implemented as part of a storage device.

9. The data processing system of claim 1, wherein the out of order codeword memory circuit includes a codeword memory area and an index area.

10. The data processing system of claim 9, wherein the codeword memory area includes a first number of codeword memory locations; and wherein the index area includes a second number of index value locations.

11. The data processing system of claim 10, wherein the first number and the second number are the same.

12. The data processing system of claim 9, wherein the first data set and the second data set are each stored in respective codeword memory locations, and wherein a stored data set remains in the same codeword memory location during the time it is maintained in the codeword memory area regardless of any out of order processing completion of other of the data sets stored in the codeword memory area.

13. The data processing system of claim 12, wherein upon convergence of a data set stored in a particular codeword memory location, an index in the index area corresponding to the particular codeword memory location is grouped with at least on other index in the index area that identify unused codeword memory locations.

14. The data processing system of claim 9, wherein each of the values in the index area corresponds to a respective codeword memory location.

15. The data processing system of claim 9, wherein the out of order codeword memory circuit further includes a pointer controller circuit, and wherein the pointer controller circuit is operable to provide a pointer identifying an index value in the index area corresponding to an unused codeword memory location to be written upon receiving the next data set.

16. The data processing system of claim 15, wherein the pointer is modified to identify another index value in the index area corresponding to another unused codeword memory location to be written upon receiving the next data set when a data set is stored to the codeword memory area.

17. The data processing system of claim 9, wherein the out of order codeword memory circuit further includes a pointer controller circuit, and wherein the pointer controller circuit is operable to provide a pointer identifying an index value in the index area corresponding to a codeword memory location that holds the next data set to be provided to the second data detector.

18. The data processing system of claim 17, wherein the pointer is modified to identify another index value in the index area corresponding to another codeword memory location that holds the next data set to be provided to the second data detector whenever a data set is provided from the codeword memory area to the second data detector.

19. A storage device, the storage device comprising:
  a storage medium;
  a read/write head assembly disposed in relation to the storage medium;
  a read channel circuit, wherein the read channel circuit receives a first data set sand a second data set from the storage medium by the read/write head assembly, and wherein the read channel circuit includes:
    an out of order codeword memory circuit operable to receive at least the first data set and the second data set, and wherein the out of order codeword memory circuit is operable to provide one of the first data set or the second data set as a processing input selected based at least in part on a first soft decision output corresponding to the first data set and a second soft decision output corresponding to the second data set.

20. The storage device of claim 19, the storage device further comprising:
  a data processing circuit including:
    a data detector circuit operable to apply a data detection algorithm to the first data set to yield the first soft decision output, and to the second data set to yield the second soft decision output; and
    a data decoder circuit operable to apply a data decoding algorithm to the first soft decision output to yield a first decoded output, and to the second soft decision output to yield a second decoded output.

21. A data processing system, the system comprising:
  an out of order codeword memory circuit operable to receive at least a first data set and a second data set, and wherein the out of order codeword memory circuit is operable to provide one of the first data set or the second data set as a processing input selected based at least in part on one of a first soft decision output corresponding to the first data set or a second soft decision output corresponding to the second data set.

22. The data processing system of claim 21, wherein the data processing system is implemented as part of an integrated circuit.

23. The data processing system of claim 21, wherein the data processing system is implemented as part of a storage device.

* * * * *